United States Patent
Haynes (10) Patent No.: US 9,853,171 B2
(45) Date of Patent: Dec. 26, 2017

(54) PHOTOVOLTAIC DEVICES WITH THREE DIMENSIONAL SURFACE FEATURES AND METHODS OF MAKING THE SAME

(71) Applicant: Zinniatek Limited, Auckland (NZ)

(72) Inventor: Andrew Leo Haynes, Auckland (NZ)

(73) Assignee: ZINNIATEK LIMITED, Auckland (NZ)

( * ) Notice: Subject to any disclaimer, the term of this patent is extended or adjusted under 35 U.S.C. 154(b) by 0 days.

(21) Appl. No.: 14/425,111

(22) PCT Filed: Sep. 4, 2013

(86) PCT No.: PCT/IB2013/001917
§ 371 (c)(1),
(2) Date: Mar. 2, 2015

(87) PCT Pub. No.: WO2014/037790
PCT Pub. Date: Mar. 13, 2014

(65) Prior Publication Data
US 2015/0206991 A1    Jul. 23, 2015

Related U.S. Application Data

(60) Provisional application No. 61/696,956, filed on Sep. 5, 2012.

(51) Int. Cl.
*H01L 31/00* (2006.01)
*H01L 31/0232* (2014.01)
(Continued)

(52) U.S. Cl.
CPC .. *H01L 31/02327* (2013.01); *H01L 31/02366* (2013.01); *H01L 31/022475* (2013.01);
(Continued)

(58) Field of Classification Search
CPC ....... H01L 31/02366; H01L 31/035281; H01L 31/03529; H01L 31/0236; H01L 31/02363
See application file for complete search history.

(56) References Cited

U.S. PATENT DOCUMENTS 4,046,457 A * 9/1977 Land ................. G03C 1/825
                                                     359/586
4,612,409 A * 9/1986 Hamakawa ....... H01L 31/03921
                                                     136/244
(Continued)

FOREIGN PATENT DOCUMENTS

CN    101360595 A    2/2009
CN    201222506 Y    4/2009
(Continued)

OTHER PUBLICATIONS

International Preliminary Report on Patentability for PCT/IB2013/001917, dated Mar. 19, 2015.
(Continued)

*Primary Examiner* — Eli Mekhlin
(74) *Attorney, Agent, or Firm* — Foley & Lardner LLP (57) ABSTRACT

This disclosure provides photovoltaic cells and substrates with three dimensional optical architectures and methods of manufacturing the same. In particular, the disclosure relates to a continuously formed photovoltaic substrate, and to systems, devices, methods and uses for such a product, including the collection of solar energy.

14 Claims, 5 Drawing Sheets

(51) Int. Cl.
*H01L 31/0236* (2006.01)
*H01L 31/075* (2012.01)
*H01L 31/076* (2012.01)
*H01L 31/056* (2014.01)
*H01L 31/0224* (2006.01)
*H01L 31/18* (2006.01)

(52) U.S. Cl.
CPC .......... *H01L 31/056* (2014.12); *H01L 31/075* (2013.01); *H01L 31/076* (2013.01); *H01L 31/1884* (2013.01); *Y02E 10/52* (2013.01); *Y02E 10/548* (2013.01)

(56) References Cited

U.S. PATENT DOCUMENTS

| | | | |
|---|---|---|---|
| 5,121,254 A * | 6/1992 | Hamanaka | G02B 3/0012 359/619 |
| 5,973,258 A * | 10/1999 | Shiotsuka | B32B 17/10678 136/251 |
| 6,259,016 B1 * | 7/2001 | Negami | H01L 31/02168 136/252 |
| 6,941,706 B2 | 9/2005 | Austin et al. | |
| 2002/0055046 A1 * | 5/2002 | Ono | H01G 9/2009 429/324 |
| 2002/0197422 A1 * | 12/2002 | Trpkovski | B23B 49/005 428/34 |
| 2004/0187913 A1 * | 9/2004 | Okada | H01L 31/076 136/255 |
| 2005/0011549 A1 * | 1/2005 | Miyoshi | H01G 9/20 136/243 |
| 2008/0000512 A1 | 1/2008 | Flaherty et al. | |
| 2009/0095346 A1 * | 4/2009 | Hurley | C23C 16/30 136/256 |
| 2010/0304522 A1 * | 12/2010 | Rana | H01L 21/26586 438/71 |
| 2011/0005575 A1 * | 1/2011 | Cao | H01L 31/02366 136/246 |
| 2011/0094584 A1 * | 4/2011 | Sawada | C03C 3/087 136/256 |
| 2011/0132456 A1 * | 6/2011 | Lin | H01L 31/03765 136/258 |
| 2011/0155245 A1 * | 6/2011 | Hsiao | H01L 31/048 136/261 |
| 2011/0162706 A1 * | 7/2011 | Borden | H01L 31/03682 136/256 |
| 2011/0168259 A1 * | 7/2011 | Murata | H01L 31/03682 136/258 |
| 2011/0189817 A1 * | 8/2011 | Takahashi | H01L 31/022466 438/98 |
| 2011/0203630 A1 * | 8/2011 | Takano | H01L 31/03921 136/244 |
| 2011/0308606 A1 * | 12/2011 | Hsieh | H01L 31/0392 136/258 |
| 2012/0031454 A1 * | 2/2012 | Fogel | H01L 31/03529 136/244 |
| 2013/0008495 A1 * | 1/2013 | Jun | C25B 1/003 136/255 |
| 2015/0020877 A1 * | 1/2015 | Moslehi | H01L 31/022441 136/256 |

FOREIGN PATENT DOCUMENTS

| | | |
|---|---|---|
| CN | 102187470 A | 9/2011 |
| JP | 2003-229584 | 8/2003 |
| JP | 2010-153570 | 7/2010 |
| JP | 2011-146529 | 7/2011 |
| KR | 2010-0067157 | 6/2010 |
| KR | 10-2011-0039777 | 4/2011 |
| WO | WO 2011128757 A1 * | 10/2011 ........... H01L 31/048 |

OTHER PUBLICATIONS

International Search Report and Written Opinion for PCT/IB2013/001917, dated Feb. 17, 2014.
Final Office Action on U.S. Appl. No. 14/003,741, dated Apr. 23, 2015, 11 pages.
Chinese First Office Action dated Mar. 3, 2016 from Chinese patent application No. 201380057704.6, with English translation (21 pages).
Chinese Second Office Action dated Oct. 19, 2016 from Chinese patent application No. 201380057704.6, with English translation (21 pages).

* cited by examiner

PHOTOVOLTAIC DEVICES WITH THREE DIMENSIONAL SURFACE FEATURES AND METHODS OF MAKING THE SAME

CROSS-REFERENCE TO RELATED APPLICATIONS

This application is a 371 National Stage Application of PCT/IB2013/001917, filed Sep. 4, 2013, which claims the benefit of U.S. Provisional Patent Application No. 61/696,956, filed on Sep. 5, 2012, the entire disclosure of which is hereby incorporated by reference for all purposes in its entirety as if fully set forth herein.

TECHNICAL FIELD

The present technology relates generally to the manufacture of photovoltaic cells and devices. In particular, the present technology relates to single- and double-sided three-dimensional substrates for use in thin film photovoltaic devices.

BACKGROUND

The following description is provided to assist the understanding of the reader. None of the information provided or references cited is admitted to be prior art to the present invention.

Photovoltaic cells convert optical energy to electrical energy and thus can be used to convert solar energy into electrical power. Photovoltaic solar cells can be made very thin and modular. The individual electrical output from one photovoltaic cell may range from a few milliwatts to a few watts. Several photovoltaic cells may be connected electrically and packaged in arrays to produce a desired amount of electricity. Photovoltaic cells can be used in a wide range of applications such as providing power to satellites and other spacecraft, providing electricity to residential and commercial properties, charging automobile batteries, etc.

In a conventional thin film solar cell, an electrode layer, a photovoltaic layer and another electrode layer are sequentially stacked. When the light enters the thin film solar cell from outside, free electron-hole pairs are generated in the photovoltaic layer by the solar energy, and the internal electric field formed by the PN junction makes electrons and holes respectively move toward two layers, so as to generate a storage state of electricity. Meanwhile, if a load circuit or an electronic device is connected, the electricity can be provided to drive the circuit or device.

The average photoelectric conversion efficiency of the current thin film solar cell is about 6-10% mainly due to a low light utilization rate. The light path of the light passing through the photovoltaic layer is limited by the thickness of the photovoltaic layer, so that the light is not effectively absorbed. Consequently, while photovoltaic devices have the potential to reduce reliance upon fossil fuels, the widespread use of photovoltaic devices has been hindered by inefficiency concerns and concerns regarding the material costs required to produce such devices. Accordingly, improvements in efficiency and/or manufacturing costs could increase usage of photovoltaic devices.

SUMMARY

This disclosure provides photovoltaic cells and substrates with three dimensional optical architectures and methods of manufacturing the same. In particular, the disclosure relates to a continuously formed photovoltaic substrate, and to systems, devices, methods and uses for such a product, including the collection of solar energy.

In one aspect, the present disclosure provides a photovoltaic cell or device comprising at least one light transmissive layer with a three dimensional surface pattern. In one embodiment, the device is a thin film photovoltaic device.

In one embodiment, the light transmissive layer comprises a front surface and a rear surface disposed opposite to the front surface, wherein the front surface has a three dimensional surface pattern and the rear surface is substantially flat. In another embodiment, the light transmissive layer comprises a front surface and a rear surface disposed opposite to the front surface, wherein the rear surface has a three dimensional surface pattern and the front surface is substantially flat. In another embodiment, the light transmissive layer comprises a front surface and a rear surface disposed opposite to the front surface, wherein both the front surface and the rear surface have a three dimensional surface pattern. The surface features can range in size from nanometer to micrometer to millimeters in length, height, width, and/or diameter.

In some embodiments, the photovoltaic cell or device further comprises (a) a first electrode layer positioned below the light transmissive layer, wherein the first electrode layer is transparent; (b) a photovoltaically-active layer positioned below the first transparent conductor; and (c) a second electrode layer positioned below the photovoltaically-active layer. In some embodiments, the second electrode layer is reflective.

In one embodiment, the first electrode layer comprises indium tin oxide (ITO), gallium indium tin oxide (GITO), zinc indium tin oxide (ZITO), and/or thin gold. In one embodiment, the photovoltaically-active layer comprises amorphous silicon, e.g., p-i-n-doped amorphous silicon. In one embodiment, the second electrode layer comprises gold, silver, aluminum, and/or copper. In another embodiment, the second electrode is a second transparent conducing electrode comprising, for example, ITO, GITO, ZITO, and/or thin gold. In one embodiment, the photovoltaically-active layer has a thickness of from 10 to 5000 nanometers. In one embodiment, the light transmissive layer comprises PMMA.

In a second aspect, the disclosure provides a method for manufacturing a photovoltaic cell or device comprising: (a) providing at least one light transmissive film with a three dimensional surface pattern, wherein the light transmissive film comprises a front surface and a rear surface disposed opposite to the front surface; (b) depositing a transparent conductive layer on the rear surface such that the deposited transparent conductive layer has a first surface that contacts the rear surface and a second surface disposed opposite to the first surface; (c) depositing a photovoltaically-active layer on the second surface such that the photovoltaic active layer is configured to receive electromagnetic radiation through the substrate layer and the first transparent conductive layer. In one embodiment, the transparent conductive layer is deposited on the rear surface by chemical vapor deposition. In one embodiment, a photovoltaically-active layer is also deposited on the front surface of the light transmissive film. In one embodiment, the photovoltaically-active layer is deposited on the second surface by chemical vapor deposition, sputtering, printing, or spraying.

In a third aspect, the disclosure provides a method for manufacturing a light transmissive film, the method comprising: (a) providing to at least one of the forming surfaces of a continuous forming machine a feed of material able to assume and retain a form after being molded between that first mentioned forming surface and a second forming surface; and (b) allowing that formation to take place as such surfaces are advanced in the same direction; wherein the output is of a form a three dimensional surface pattern adapted for assembly into a thin film photovoltaic cell. In other embodiments, the substrate with 3D surface features is manufactured by embossing, stamping, injection molding, or rolling. In one embodiment, the material is PMMA.

In a fourth aspect, the disclosure provides a method for converting electromagnetic energy into electrical energy comprising: (a) receiving electromagnetic radiation through a light transmissive substrate layer having 3D surface features; (b) transmitting the radiation into at least one photovoltaically-active layer through a transparent electrode beneath the light transmissive substrate layer; (c) generating excitons in the photovoltaically-active layer, and separating the excitons into electrons and holes; and (d) removing the electrons into an external circuit.

The foregoing summary is illustrative only and is not intended to be in any way limiting. In addition to the illustrative aspects, embodiments, and features described above, further aspects, embodiments, and features will become apparent by reference to the following drawings and the detailed description.

DETAILED DESCRIPTION

It is to be appreciated that certain aspects, modes, embodiments, variations and features of the invention are described below in various levels of detail in order to provide a substantial understanding of the present technology.

The present technology is described herein using several definitions, as set forth throughout the specification. Unless otherwise stated, the singular forms "a," "an," and "the" include the plural reference. For example, a reference to "a device" includes a plurality of devices.

As used herein the term "and/or" means "and" or "or", or both.

As used herein "(s)" following a noun means the plural and/or singular forms of the noun.

Relative terms, such as "lower" or "bottom", "upper" or "top," and "front" or "back" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The term "comprising" as used in this specification means "consisting at least in part of". When interpreting statements in this specification which include that term, the features, prefaced by that term in each statement, all need to be present but other features can also be present. Related terms such as "comprise" and "comprised" are to be interpreted in the same manner.

Overview

Inefficiency concerns and production costs have prevented the widespread adoption of photovoltaic (PV) devices. The present disclosure describes photovoltaic devices that include one or more layers that comprise three-dimensional surface features through which incident light must pass before reaching a photovoltaically-active layer. These three-dimensional surface features scatter the light such that the path of the light through the photovoltaic device is increased. Increasing the light path through the photovoltaically-active layer can increase the photocurrent that flows through the photovoltaically-active layer and therefore increase the overall electrical power produced by the device. Thus, the efficiency of the photovoltaic devices (e.g., the amount of electrical power produced) can be increased and/or the thickness of the photovoltaically-active layer can be decreased resulting in lower material costs.

Reducing the thickness of the photovoltaically-active layer can also help to reduce the device degradation (e.g., Steabler-Wronski effect in amorphous-Si), thus increasing the stable performance lifetime of the photovoltaic device. Furthermore, the diffusive nature of the scattered incident light reduces the dependence of the photovoltaic device efficiency on the location of the sun. For example, when sun light is incident on the photovoltaic device at an oblique angle relative to the photovoltaic device, one or more three-dimensional surface features may act to reduce the amount of light that is reflected away from the device. Reducing the angular dependence of incident light can expand the installation flexibility of photovoltaic devices and increases the overall power output.

Various aspects of the technology will be described in detail below.

Three-Dimensional Light Transmissive Substrate Layers

In one aspect, the present technology provides a photovoltaic cell or device comprising at least one light transmissive layer with a three dimensional surface pattern. In some embodiments, the layer is patterned on one side only, with the other side being substantially flat. In other embodiments, the layer is patterned on both sides, where the pattern on each side may be the same or different. In some embodiments, the light transmissive layer substantially covers the entire photovoltaic cell or device. In other embodiments, the light transmissive layer covers less than the entire photovoltaic cell or device. For example, the light transmissive layer may form a grid pattern over the device. Materials suitable for use in the light transmissive layer include polymethylmethacrylate (PMMA), perfluorocyclobutane (PFBC) containing polymers, such as perfluorocyclobutane poly(arylether)s, ethylene tetrafluoroethylene (ETFE), silicone, polyethylene naphthalate (PEN) and thermoplastic polyurethane (TPU). In some embodiments, a three dimensional substrate layer is incorporated in a thin film photovoltaic device.

The light transmissive layer typically comprises a front surface and a rear surface. Either the front surface, the rear surface, or both the front and rear surfaces may comprise a three-dimensional surface pattern. The three-dimensional surface pattern can have any desired shape and size. In some embodiments, the three dimensional surface pattern is an array of nano or microstructures which are shaped and oriented to produce a desired alignment. In some embodiments, each surface may have a variety of surface features. For example, a particular surface may have a mixture or combination of different size and shaped surface features. In some embodiments, the three-dimensional surface pattern is configured for optimal light capture from a variety of incident angles.

In one embodiment, the three dimensional surface features include an array of upstanding mounds. In other embodiments, the features may include square posts, rounded posts, cylinders, rods, pyramids, domes, walls, fibers, nipples, craters, wells, and other promontories which are shaped and/or orientated to permit light capture from many incident angles. In another embodiment, smaller three-dimensional structures are patterned on larger three dimensional structures on one or both sides of the light transmissive layer.

In an illustrative embodiment, the three dimensional surface features are mounds. The mounds can have any desired diameter and height. In some embodiments, the mounds are nano-, micro-, or millimeter-sized. In some embodiments, the mounds have a diameter at the base ranging from about 1 nm to about 2 mm, and a height ranging from about 1 nm to about 2 mm. In other embodiments, the mounds have a diameter at the base ranging from about 50 µm to about 1 mm and a height ranging from about 50 µm to about 1 mm. In some embodiments, the mounds have a diameter at the base at the ranging from about 20 µm to about 800 µm, and a height ranging from about 20 µm to about 800 µm. In a suitable embodiment, the mounds have a diameter at the base of about 100 µm and a height of about 100 µm. Each mound is suitably a discrete structure, but neighboring mounds could be connected together by material at their bases.

In another illustrative embodiment, the three dimensional surface features are posts. The posts may be square or rounded, and the tops of the posts can be rounded or flat. The posts may have substantially straight sides, either normal or tilted with respect to the major planes of the substrate, or the posts may have curved or irregular surface shape or configuration. For example, the cross section of the posts may be triangular, square, circular, elliptical or polygonal. In some embodiments, the posts have a length and/or width ranging from about 1 µm to about 2 mm, and a height ranging from about 1 µm to about 2 mm. Each post is suitably a discrete structure, but neighboring posts could be connected together by material at their bases.

Transparent Electrode Layer

The photovoltaic cell or device may include a first electrode layer positioned below the light transmissive layer, wherein the first electrode layer is transparent, i.e., capable of at least partially transmitting light. As used herein, the term "electrode" refers to a layer that provides a medium for delivering current to an external circuit or providing bias voltage to the photovoltaic cell or device. In some embodiments, the electrode provides an interface between the photovoltaically-active layers and a wire, lead, or other means for transporting the charge carriers to or from an external circuit. In some embodiments, the transparent electrode layer will have three dimensional surface features that correspond to or mirror the three dimensional surface features on the rear surface of the light transmissive layer described above.

In some embodiments, the transparent first electrode comprises a transparent conducting oxide, including but not limited to, indium tin oxide (ITO), gallium indium tin oxide (GITO), zinc indium tin oxide (ZITO), and/or gold. In some embodiments, the transparent first electrode comprises one or more conducting polymer materials, such as polyanaline (PANI), 3,4-polyethylenedioxythiophene (PEDOT), graphene, carbon nanotubes, or any combination thereof. In some embodiments, the transparent first electrode is doped with a dopant (e.g., sodium) to achieve lower resistivity. In some embodiments, the transparent first electrode layer may include a grid of a metal (e.g., copper, gold) to enhance the conductivity.

In some embodiments, the transparent first electrode has a thickness ranging from about 1 nm to about 10 µm. In other embodiments, the transparent first electrode has a thickness ranging from about 10 nm to about 800 nm. In some embodiments, the transparent first electrode has a thickness ranging from about 100 nm to about 900 nm.

Photovoltaically-Active Layer

The photovoltaic cell or device may include one or more photovoltaically-active layers positioned below the transparent first electrode. A photovoltaically-active layer of a photovoltaic device described herein can have a variety of thicknesses. In some embodiments, the thickness of the photovoltaically-active layer ranges from about 1 nm to about 10 µm.

In some embodiments, the one or more photovoltaically-active layers comprise an amorphous material. In some embodiments, the one or more photovoltaically-active layers comprises amorphous silicon (a-Si). The amorphous silicon of may be unpassivated or substantially unpassivated. In some embodiments, the amorphous silicon is passivated with hydrogen (a-Si:H) or a halogen.

In some embodiments, the one or more photovoltaically-active layers comprise a crystalline material or a polycrystalline material. In one embodiment, the one or more photovoltaically-active layers comprise an organic material. The organic material may include one or more of poly(3-hexylthiophene), poly(3-octylthiophene), fullerenes, carbon nanotubes or mixtures thereof.

In some embodiments, the one or more photovoltaically-active layers comprises a group IV semiconductor material, a group II/VI semiconductor material, a group III/V semiconductor material, or combinations or mixtures thereof. In some embodiments, a photovoltaically-active layer comprises a group IV, group II/VI, or group III/V binary, ternary or quaternary system. In some embodiments, a photovoltaically-active layer comprises a I/III/VI material, such as copper indium gallium selenide. In some embodiments, the one or more photovoltaically-active layers comprises polycrystalline silicon (Si). In one embodiment, the one or more photovoltaically-active layers comprise quantum dots.

In some embodiments, the photovoltaic cell or device comprises at least one photosensitive layer comprising an n-type region, an intrinsic region, and a p-type region. In some embodiments, an n-type region includes an n-doped semiconductor. In some embodiments, a p-type region includes a p-doped semiconductor. In some embodiments, an intrinsic region includes an undoped semiconductor. In some embodiments, the photovoltaic cells or devices comprise multi-junction constructions. In one embodiment, the photovoltaic device comprises a plurality of photovoltaically-active layers, each layer comprising an n-type region, an intrinsic region, and a p-type region. In another embodiment, the photovoltaic device comprises two photovoltaically-active layers, thereby providing a double junction device. In another embodiment, the photovoltaic device comprises three photovoltaically-active layers, thereby providing a triple junction device.

Second Electrode

The photovoltaic cell or device may include a second (or back) electrode layer positioned below the photovoltaically-active layer. In some embodiments, the second electrode is transparent. In other embodiments, the second electrode is not light transmissive. In some embodiments, the second electrode is reflective. In some embodiments, the second electrode comprises a metal. As used herein, the term "metal" refers to both elementally pure metal (e.g., gold) and also metal alloy (e.g., materials composed of two or more elementally pure metals). In some embodiments, the second electrode comprises one or more of gold, silver, aluminum, and copper. In some embodiments, the second electrode can have a thickness ranging from about 1 nm to about 10 µm. In other embodiments, the second electrode can have a thickness ranging from about 10 nm to about 1 µm. In some embodiments, the second electrode can have a thickness ranging from about 100 nm to about 900 nm. In some embodiments, the second electrode is reflective and capable of reflecting at least a portion of radiation not absorbed by the photosensitive layer back into the photosensitive layer for additional opportunities for absorption.

In some embodiments, the photovoltaic cell or device may further comprise an external metallic contact. In some embodiments, the external metallic contact surrounds the second electrode and is in electrical communication with the second electrode. The external metallic contact can be operable to extract current over at least a portion of the circumference and length of the photovoltaic device. The external metallic contact may include metals such as gold, silver, or copper.

Assembly of Devices

In some embodiments, a photovoltaic cell or device described herein comprises at least one light transmissive layer with a three dimensional surface pattern, a transparent first electrode layer positioned below the light transmissive layer; a photovoltaically-active layer positioned below the transparent first electrode; and a second electrode layer positioned below the photovoltaically-active layer and electrically connected to the photovoltaically-active layer. The device may further comprise a plastic substrate or backing and metal contacts for an electrical connection to a load or circuit.

Figure 1:
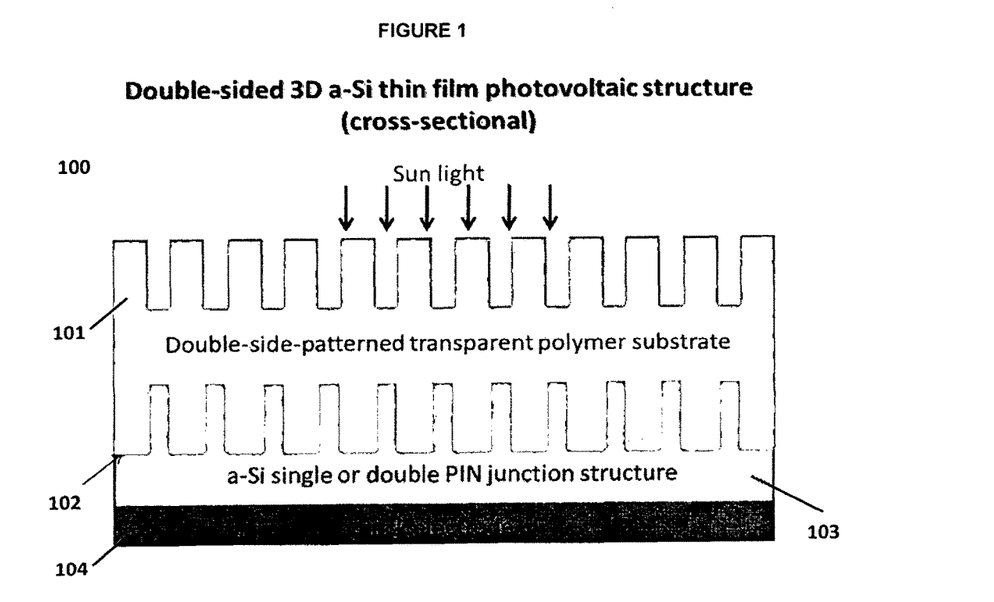
FIG. 1 is a cross sectional view of an illustrative photovoltaic device comprising a two-sided three-dimensional substrate layer according to one embodiment described herein.

FIG. 1 illustrates a cross sectional view of a photovoltaic device 100 having a double-sided 3D substrate 101 structure according to one embodiment described herein (not shown to scale). The photovoltaic device 100 shown in FIG. 1 comprises a double-sided patterned transparent polymer substrate 101. As discussed above, the transparent polymer substrate 101 may be, for example, PMMA.

The double-sided patterned transparent polymer substrate layer is positioned above a transparent first electrode 102. The transparent first electrode 102 can comprise, for example, a light transmissive conducting oxide (TCO) such as indium tin oxide, gallium indium tin oxide, or zinc indium tin oxide.

The transparent first electrode 102 is positioned above a photovoltaically-active layer 103, e.g., an a-Si single or double PIN junction structure. The photovoltaically-active layer 103, in some embodiments, can be in direct electrical communication with the transparent first electrode 102. In other embodiments, a charge transfer layer (not shown) may be disposed between the transparent first electrode 102 and the photovoltaically-active layer 103 to provide indirect electrical communication between the transparent first electrode 102 and the photovoltaically-active layer 103.

The photovoltaically-active layer 103 is positioned above a second (back) electrode 104. The photovoltaically-active layer 103 can be in direct electrical communication with the back electrode 104. In other embodiments, a charge transfer layer (not shown) may be disposed between the photovoltaically-active layer 103 and the back electrode 104 to provide indirect electrical communication between the photovoltaically-active layer 103 and the back electrode 104. In some embodiments, the back electrode 104 comprises a metal, such as aluminum, gold, silver, nickel, or copper.

Figure 2A:
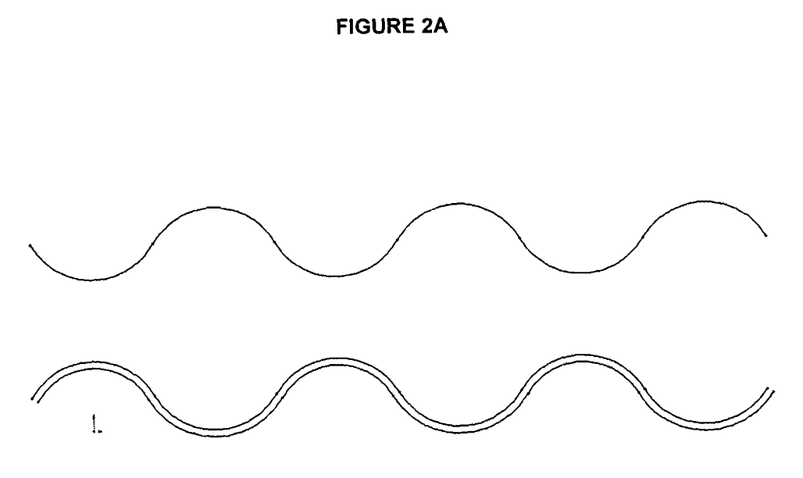
FIG. 2A is a cross sectional view of an illustrative two-sided three-dimensional substrate layer according to one embodiment described herein.
Figure 2B:
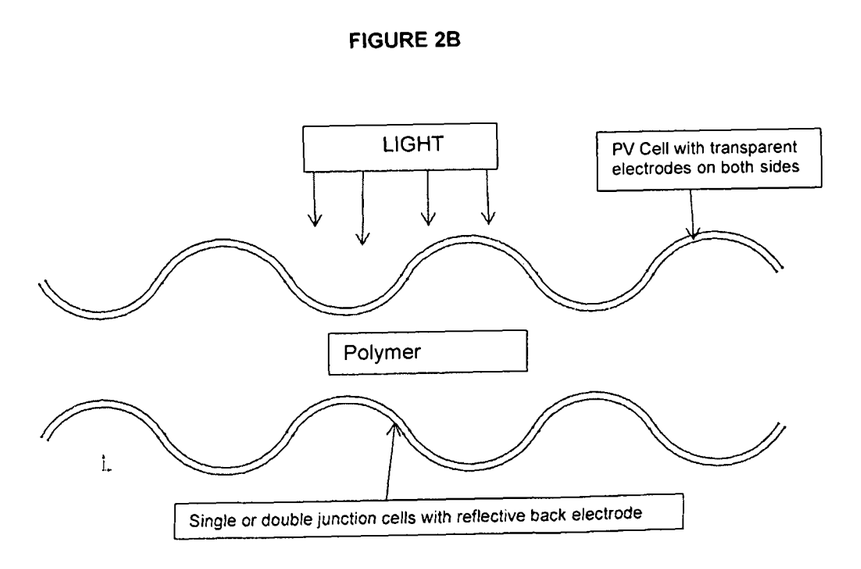
FIG. 2B is a cross sectional view of an illustrative two-sided three-dimensional substrate layer with a PV Cell having transparent electrodes on both sides according to one embodiment described herein.

FIG. 2A illustrates a cross sectional view of an alternate double-sided 3D substrate structure according to one embodiment described herein. In this embodiment, the three dimensional surface features include an array of upstanding mounds. FIG. 2B illustrates a cross sectional view of an alternate double-sided 3D substrate structure showing a PV cell having transparent electrodes on both sides.

Methods of Manufacturing

In one aspect, the present disclosure provides methods for manufacturing the light transmissive 3D substrate as described in herein. In one embodiment, the substrate with 3D surface features is manufactured in long strips by a continuous process which incorporates a continuous forming step, or "CFT Process" (see PCT/NZ2006/000300, published as WO2007/058548, and PCT/NZ2009/000214, published as WO2010/041962), and therefore can be made in varying lengths as required. Production is such that a single molded substrate, suitable for an entire roll of thin film photovoltaic cells, can be manufactured. In some embodiments, the substrate is about 1-20 meters in length, about 3-10 meters in length, or about 4-8 meters in length, or 2-4 meters in length, but the manufacturing process allows custom lengths to be accommodated. In other embodiments, the substrate with 3D surface features is manufactured by embossing, stamping, injection molding, or rolling.

In another aspect, the present disclosure provides methods for manufacturing a photovoltaic cell or device as described herein. For example, once a light transmissive substrate with 3D surface features has been produced, additional layers of a thin film photovoltaic device can be added. In one embodiment, disposing a transparent first electrode on a light transmissive substrate comprises sputtering or dip coating a transmissive conductive oxide onto a surface of the substrate. In some embodiments, disposing a photovoltaically-active layer in electrical communication with the first electrode comprises depositing the active layer using one or more standard fabrication methods, including one or more of solution-based methods, vapor deposition methods, and epitaxy methods. In some embodiments, the chosen fabrication method is based on the type of photovoltaically-active layer deposited.

In some embodiments, an a-Si layer can be deposited using plasma enhanced chemical vapor deposition (PECVD), hot wire chemical vapor deposition (HWCVD), sputtering or photo-CVD. In some embodiments, disposing a second electrode in electrical communication with the photovoltaically-active layer may include depositing the second electrode on the active layer through vapor phase deposition, spin coating, or dip coating.

Methods of Use

In one aspect, the disclosure provides methods of converting electromagnetic energy into electrical energy. In some embodiments, a method of converting electromagnetic energy into electrical energy comprises receiving electromagnetic radiation through a light transmissive substrate layer having 3D surface features, transmitting the radiation into at least one photovoltaically-active layer through a transparent electrode beneath the light transmissive substrate layer having 3D surface features, generating excitons in the photovoltaically-active layer, and separating the excitons into electrons and holes. In some embodiments, the light transmissive substrate layer having 3D surface features comprises any material described herein. In some embodiments, the photovoltaically-active layer comprises any material described herein. In some embodiments, the transparent electrode comprises any transparent electrode described herein. In some embodiments, the method further comprises removing the electrons into an external circuit.

EXAMPLES

The present compositions and methods, thus generally described, will be understood more readily by reference to the following examples, which are provided by way of illustration and are not intended to be limiting.

Example 1—Light Transmission/Reflection Test for Single Sided 3D Substrates

A light transmission/reflection/absorption was performed on six samples: Flat PMMA, PMMA with 100 μm surface features (PMMA-100), PMMA with 3 μm surface features (PMMA-3), an ETFE sheet and glass. A stainless steel tube with the same size of the sample and an optical powermeter sensor was used to avoid any possible light loss due to the light dispersion. The sample and the light source (LED) were aligned at the same line (angle).

The total power of the light was obtained by testing air only. The power is 146 (transmission)+5.45 (reflection) =151.95 μW. This power was stabilized by setting the current in the LED to be 70 mA which locks the light intensity. For the glass sample, out of 151.95 μW light power, 149.04 μW was transmitted and reflected. Only 2.91 μW power was absorbed. The absorbed light power is then converted to heat or redirected and emitted to other directions or both.

Figure 3:
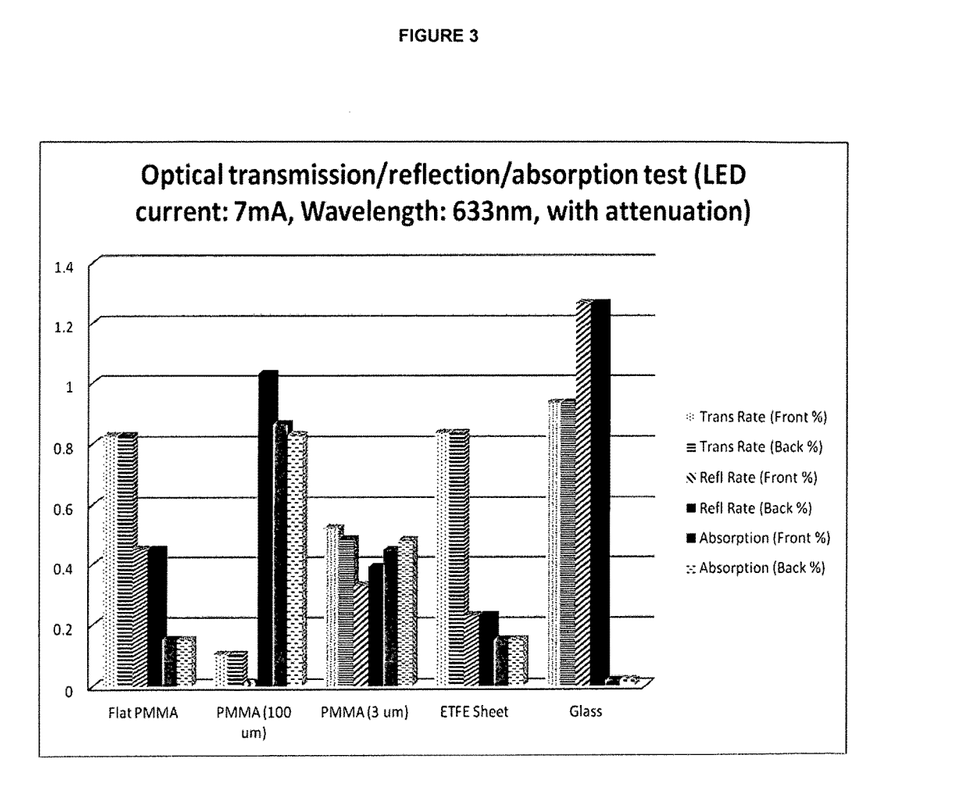
FIG. 3 is a chart showing the optical transmission, reflection, and adsorption properties of illustrative embodiments of the materials described herein.

The results for the samples are shown in FIG. 3. For PMMA-100, the power loss in the front was 86.38% and the power loss from the back was 82.79%. Consequently, 86.38% of the light was absorbed (not transmitted nor reflected) in the front while 82.79% of the light was absorbed in the back. The absorbed light is partly transformed to heat or redirected to other directions. However, 71.14% more light was absorbed in the front compared to flat PMMA, while 67.55% more of the light was absorbed in the back compared to flat PMMA. This amount of excess light is trapped inside of the PMMA-100 sample. Without wishing to be limited by theory, it is believed that the trapping mechanism of the PMMA-100 is the result of light bouncing forward and back at the interfaces of structured PMMA/air, which is in part due to the increased angle of incidence provided by the three-dimensional patterning.

Furthermore, the light trapping is different between the front and the back of the PMMA-100. The transmission is almost the same for the front and back; however, more light was reflected from the back than from the front. However, compared to flat PMMA, less light is reflected when the structured surface is facing the light yet more light is reflected when the back (flat) of the sample is facing the light. This indicates that the structured side is an anti-reflection surface. These studies of the PMMA-100 material can be summarized as follows:

(1) PMMA-100 is a good light absorber/trapper. More light is trapped inside of the sample compared to other samples. This implies that more light can be used (e.g., to convert to other forms of energy);

(2) The structured side of PMMA when facing the light is a good anti-reflective surface;

(3) When the flat side of PMMA is facing the light, more reflection will happen because of the larger surface area interface; and (4) The geometry of the features on the surface PMMA-100 increases the amount of light captured from all incident angles.

For the PMMA-3, the transmission, reflection and absorption are similar to the case of PMMA-100. However, the absorption is less than the PMMA-100. This is because of the larger transmission for PMMA-3 compared to PMMA-100. The reason for this could be that the feature size of the PMMA-3 is much smaller than the PMMA-100, which results in the weaker light trapping ability.

Example 2—Light Transmission/Reflection Test for Double-Sided 3D Substrates

A light transmission/reflection/absorption was performed on eight samples: Flat PMMA, PMMA with 100 μm surface features on one side (PMMA-100), and six samples (1-6) which are patterned with 100 μm surface features on both sides. Samples 1 to 4 are transparent, and differ in the alignment of the surface features across the two sides. Sample 5 and Sample 6 are identical to Sample 1 and 2, respectively, except one side was painted black so that no light could pass through.

All of the samples were normalized against the air. A stainless steel tube with the same size of the sample and an optical powermeter sensor was used to avoid any possible light loss due to the light dispersion. The sample and the light source (LED) were aligned at the same line (angle).

Figure 4:
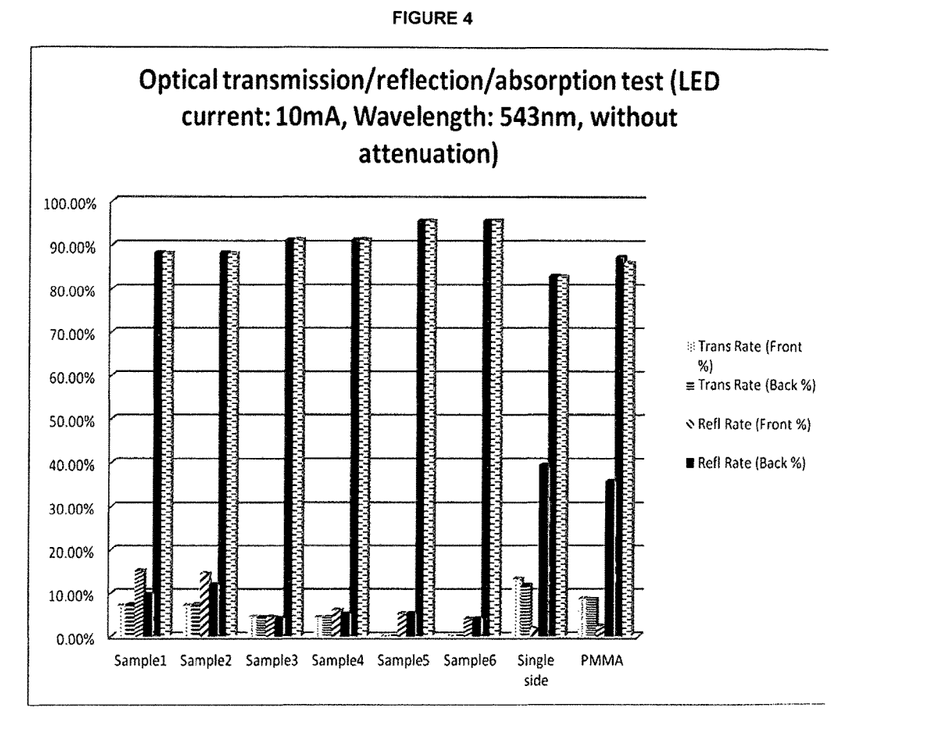
FIG. 4 is a chart illustrating the optical transmission, reflection, and adsorption properties of illustrative embodiments of the materials described herein.

The results are shown in FIG. 4. The double-sided 3D samples absorbed the light greatly, especially the ones with one side painted. These results indicate that a significant amount of light has been kept inside the sample. The results also show that double sided 3D substrates absorb more light than single sided substrates.

Example 3—Angular Dependence Testing

An angular dependence test was performed on six samples: Flat PMMA, PMMA with 100 μm surface features (PMMA-100), PMMA with 3 μm surface features (PMMA-3), and glass. This test examined the transmission of light when the samples were subjected to the incident light at different angles.

Figure 5:
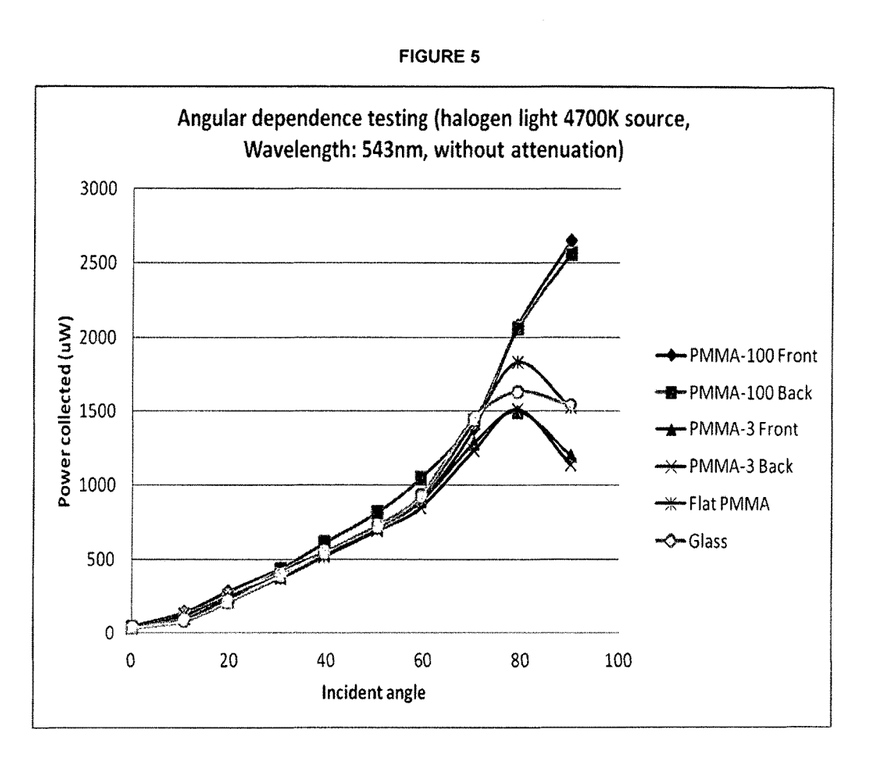
FIG. 5 is a chart illustrating the angular dependence of illustrative embodiments of the materials described herein.

The data is shown in FIG. 5. Samples with three-dimensional surface features trap and transmit more light than the flat sample when the incident angle is small. The PMMA-100 sample performed the best.

The present disclosure is not to be limited in terms of the particular embodiments described in this application. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 particles refers to groups having 1, 2, or 3 particles. Similarly, a group having 1-5 particles refers to groups having 1, 2, 3, 4, or 5 particles, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

All references cited herein are incorporated by reference in their entireties and for all purposes to the same extent as if each individual publication, patent, or patent application was specifically and individually incorporated by reference in its entirety for all purposes.

What is claimed is:

1. A photovoltaic cell or device comprising at least one light transmissive layer with a three dimensional surface pattern, wherein:
   the light transmissive layer comprises a front surface and a rear surface disposed opposite to the front surface,
   both the front surface and the rear surface have a three dimensional surface pattern or patterns, wherein the three dimensional surface pattern or patterns of the front surface and the rear surface include a plurality of surface features each having at least one of a different size or a different shape,
   the light transmissive layer is disposed over a photovoltaically-active layer of the photovoltaic cell or device such that the three dimensional surface pattern or patterns on the front surface and the rear surface are both disposed over a single, continuous layer of the photovoltaically-active layer;
   wherein the light transmissive layer is approximately symmetrical across a plane that passes between the three dimensional surface pattern or patterns of the front surface and the three dimensional surface pattern or patterns of the rear surface; and
   the three dimensional surface pattern or patterns are configured to cause at least some light that enters the light transmissive layer to reflect multiple times between the front surface and the rear surface within the light transmissive layer.

2. The photovoltaic cell or device of claim 1, further comprising:
   a first electrode layer positioned below the light transmissive layer, wherein the first electrode layer is transparent;
   the photovoltaically-active layer positioned below the first electrode layer; and
   a second electrode layer positioned below the photovoltaically-active layer.

3. The photovoltaic cell or device of claim 2, wherein the first electrode layer comprises a transparent conductive layer comprising indium tin oxide (ITO), gallium indium tin oxide (GITO), zinc indium tin oxide (ZITO), and/or thin gold.

4. The photovoltaic cell or device of claim 2, wherein the second electrode layer comprises gold, silver, aluminum, and/or copper.

5. The photovoltaic cell or device of claim 2, wherein the photovoltaically-active layer has a thickness of from 10 to 5,000 nanometers.

6. The photovoltaic cell or device of claim 2, wherein the second electrode layer comprises a front surface in contact with the photovoltaically-active layer and a rear surface disposed opposite to the front surface, and wherein the rear surface comprises paint.

7. The photovoltaic cell or device of claim 6, wherein the paint is black.

8. The photovoltaic cell or device of claim 1, wherein the light transmissive layer comprises polymethyl-methacrylate (PMMA).

9. The photovoltaic cell or device of claim 1, wherein the device is a thin film photovoltaic device.

10. The photovoltaic cell or device of claim 1, wherein the three dimensional surface pattern or patterns on at least one of the front surface and the rear surface comprise features approximately 100 micrometers in height, measured from the base of the features to a top of the features.

11. The photovoltaic cell or device of claim 1, wherein the three dimensional surface pattern or patterns comprise mound-shaped features.

12. The photovoltaic cell or device of claim 1, wherein the three dimensional surface pattern or patterns comprises mound shapes such that the mound shapes on the front surface are oriented to align with the mound shapes on the rear surface.

13. The photovoltaic cell or device of claim 1, further comprising a second photovoltaically-active layer that is light transparent disposed on the front surface of the light transmissive layer.

14. The photovoltaic cell or device of claim 1, wherein the photovoltaically-active layer comprises amorphous silicon.

* * * * *